(12) United States Patent
Miyamoto

(10) Patent No.: US 8,484,832 B2
(45) Date of Patent: Jul. 16, 2013

(54) METHOD OF PRODUCING PRINTED CIRCUIT BOARD INCORPORATING RESISTANCE ELEMENT

(75) Inventor: Garo Miyamoto, Tsukuba (JP)

(73) Assignee: Nippon Mektron, Ltd., Tokyo-To (JP)

( * ) Notice: Subject to any disclaimer, the term of this patent is extended or adjusted under 35 U.S.C. 154(b) by 648 days.

(21) Appl. No.: 12/791,701

(22) Filed: Jun. 1, 2010

(65) Prior Publication Data
US 2010/0236065 A1 Sep. 23, 2010

Related U.S. Application Data

(62) Division of application No. 11/979,890, filed on Nov. 9, 2007, now Pat. No. 7,765,680.

(30) Foreign Application Priority Data

Nov. 20, 2006 (JP) ................................ 2006-312959

(51) Int. Cl.
*H01C 17/00* (2006.01)
(52) U.S. Cl.
USPC ............... 29/610.1; 29/620; 29/829; 29/830; 29/846; 338/204; 338/252; 338/310
(58) Field of Classification Search
USPC .......... 29/610.1, 25.41, 25.42, 620, 829–832, 29/846; 338/204, 249, 252, 260, 309, 310
See application file for complete search history.

(56) References Cited

U.S. PATENT DOCUMENTS

| | | | |
|---|---|---|---|
| 7,049,929 | B1 | 5/2006 | Fjelstad .......................... 338/310 |
| 7,277,005 | B2 * | 10/2007 | Kang et al. ..................... 338/309 |
| 2004/0139589 | A1 * | 7/2004 | Bothe et al. .................... 29/25.41 |

FOREIGN PATENT DOCUMENTS

| | | |
|---|---|---|
| JP | 03-073503 | 3/1991 |
| JP | 03-288463 | 12/1991 |
| JP | 07-188391 | 7/1995 |
| JP | 10-233565 | 9/1998 |
| JP | 11-340633 | 12/1999 |
| JP | 2002-185099 | 6/2002 |
| JP | 2004-228165 | 8/2004 |
| JP | 2006-222110 | 8/2006 |

* cited by examiner

*Primary Examiner* — Thiem Phan
(74) *Attorney, Agent, or Firm* — Jacobson Holman PLLC

(57) ABSTRACT

There is provided a method of producing a printed circuit board incorporating a resistance element capable of adjusting resistance after the resistance element has been formed and assuring a high accurate resistance. A method of producing a printed circuit board incorporating a resistance element using carbon paste includes the steps of: forming through holes 5, 6, 25 and 26 or a bottomed hole in a double-sided copper clad laminate; applying noble metal plating into the through hole or the bottomed hole; filling the through hole or the bottomed hole with carbon paste; subjecting the carbon paste with which the thorough hole or the bottomed hole is filled to noble metal plating, conducting treatment and plating to form a conductive layer; forming an opening 18 in the conductive layer on the end of the through hole filled with the carbon paste; and performing trimming through the opening to adjust the resistance of the resistor formed by the carbon paste.

1 Claim, 4 Drawing Sheets

METHOD OF PRODUCING PRINTED CIRCUIT BOARD INCORPORATING RESISTANCE ELEMENT

This application is a Divisional Application of U.S. Ser. No. 11/979,890, filed Nov. 9, 2007 now U.S. Pat. No. 7,765,680.

BACKGROUND OF THE INVENTION

1. Field of the Invention

The present invention relates to a method of producing a printed circuit board, and in particular to a method of producing a printed circuit board incorporating a resistance element using carbon paste.

2. Related Art

Reduction in size and thickness of electronic components has been demanded in late years, at the same time, electronic components and printed circuit boards on which the electronic components are mounted are also demanded to reduce size thereof by miniaturizing a pattern and increasing its density and to reduce thickness thereof by using a thin material.

A printed circuit board is being developed which incorporates a resistor element formed by printing carbon paste instead of a conventional surface-mounted chip resistor. This printed circuit board reduces an area where chip resister components are mounted. Furthermore, the resistor element using carbon paste can be thinned as compared with a chip resister component, so that the printed circuit board can be reduced, in size and thickness.

In a printed circuit board disclosed in Japanese Patent Laid-Open No. 11-340633 (refer to "paragraph number 0014") and Japanese Patent No. 2547650 (page 2, column 3, line 29 to column 4, line 3) in which a resistance element is formed using carbon paste, problems arise such as printing blur due to a step on a printing surface, printing sag and dispersion in film thickness when the carbon paste is formed using a screen printing method, so that a percent dispersion of resistance of some resistance elements is about 15.

In addition to the above, the resistance is varied by heat and pressure generated in a laminating process when the above printed circuit board is multi-layered and incorporates a resistance element, so that it is difficult to keep the accuracy of the resistance after the resistance element has been incorporated.

In Japanese Patent Laid-Open No. 2006-222110 (refer to "paragraph number 0022"), the surface treatment of an electrode is transferred from paste printing to plating to reduce a step on printing surface, however, measures are not taken for change in resistance in a laminating process.

In a printed circuit board disclosed in Japanese Patent Laid-Open No. 2002-185099 (refer to "paragraph number 0016") in which a resistance element is formed using carbon paste, a through hole or bottomed hole is filled with the carbon paste to form the resistance element. Filling the through hole or via hole with the carbon paste enables reduction in the dispersion of resistance related to the printing problems posed in Japanese Patent Laid-Open No. 11-340633 and Japanese Patent No. 2547650.

Since neither carbon paste nor copper is stable in resistance because a mutual contact resistance is high, the accuracy of the resistance cannot be assured. The resistance element in which a copper electrode is brought into contact with carbon paste has such a problem that the resistance element is influenced by moisture and oxygen in the air after the resistance element has been formed to increase contact resistance at the interface between copper being an electrode material and the carbon paste, leading to variation in resistance.

Furthermore, an accuracy required for a resistor used as a termination resistor and in a filter in a transmission line is 1% or less, so that an accurate trimming technique using laser processing is needed to improve the accuracy of the resistor. However, a resistance element in which a through hole or via hole is filled with carbon paste has a problem in that the resistance cannot be adjusted using trimming technique such as laser processing after formed.

FIG. 4 is a cross section of a process chart illustrating a method of producing a printed circuit board incorporating a resistance element using carbon paste described in Japanese Patent Laid-Open No. 2002-185099. As illustrated in FIG. 4(1), a so-called double-sided copper clad laminate 24 is prepared in which both sides of an insulating base material 21 of polyimide are provided with a first and a second conductive layer 22 and 23 of copper foil. Through holes 25 and 26 are formed in required positions by drilling or laser processing.

As illustrated in FIG. 4(2), a carbon paste 27 is applied to the through hole 25 by screen printing and thermoset. Then, as illustrated in FIG. 4(3), the first and the second conductive layer 22 and 23, through hole 26 and carbon paste 27 are subjected to a conducting treatment to form a plating film 28.

As illustrated in FIG. 4(4), the first and the second conductive layer 22 and 23 and the plating film 28 are etched by a photo fabrication method to form circuit patterns 29 and 30, thereby obtaining a printed circuit board 31 incorporating a resistance element using the carbon paste.

As described above, the resistance of a resistance element in which a through hole or bottomed hole is filled with carbon paste cannot be adjusted using trimming technique such as laser processing after the resistance element has been formed. For this reason, it is difficult to produce a resistor with an accurate resistance by the carbon-paste filling method.

The present invention has been made in view of the above problems and has for its purpose to provide a method of producing a printed circuit board incorporating a resistance element capable of adjusting resistance after the resistance element has been formed and assuring a high accurate resistance.

SUMMARY OF THE INVENTION

To achieve the above purpose, the present specification provides the following invention.

A first aspect of the present invention provides a method of producing a printed circuit board incorporating a resistance element using carbon paste including the steps of:
 forming a through hole in a double-sided copper clad laminate;
 applying noble metal plating into the through hole;
 filling the through hole with carbon paste;
 subjecting the carbon paste with which the thorough hole is filled to noble metal plating, conducting treatment and plating to form a conductive layer;
 forming an opening in the conductive layer on the end of the through hole filled with the carbon paste; and
 performing trimming through the opening to adjust the resistance of the resistor formed by the carbon paste.

A second aspect of the present invention provides a method of producing a printed circuit board incorporating a resistance element using carbon paste including the steps of:
 forming a bottomed hole in a double-sided copper clad laminate;
 applying noble metal plating into the bottomed hole;
 filling the bottomed hole with carbon paste;

subjecting the carbon paste with which the bottomed hole is filled to noble metal plating, conducting treatment and plating to form a conductive layer;

forming an opening in the conductive layer on the end of the bottomed hole; and performing trimming through the opening to adjust the resistance of the resistor formed by the carbon paste.

The advantages provide the following effect for the present invention.

According to the first aspect, opening at least one of the lid plating portions of the through hole filled with the carbon paste enables resistance to be adjusted using trimming technique such as laser processing after the resistor has been formed. This is applicable to a termination resistor in a transmission line and a resistance element used in a filter of which an error required accuracy in resistance is 1% or less.

According to the second aspect, opening the lid plating portion of the bottomed hole filled with carbon paste enables resistance to be adjusted using trimming technique such as laser processing after the resistor has been formed. This is applicable to a termination resistor in a transmission line and a resistance element used in a filter of which an error required accuracy in resistance is 1% or less.

DETAILED DESCRIPTION OF THE INVENTION

The embodiments of the present invention are described below with reference to FIGS. 1A and 1B to FIG. 3.

First Embodiment

Figure 1A:
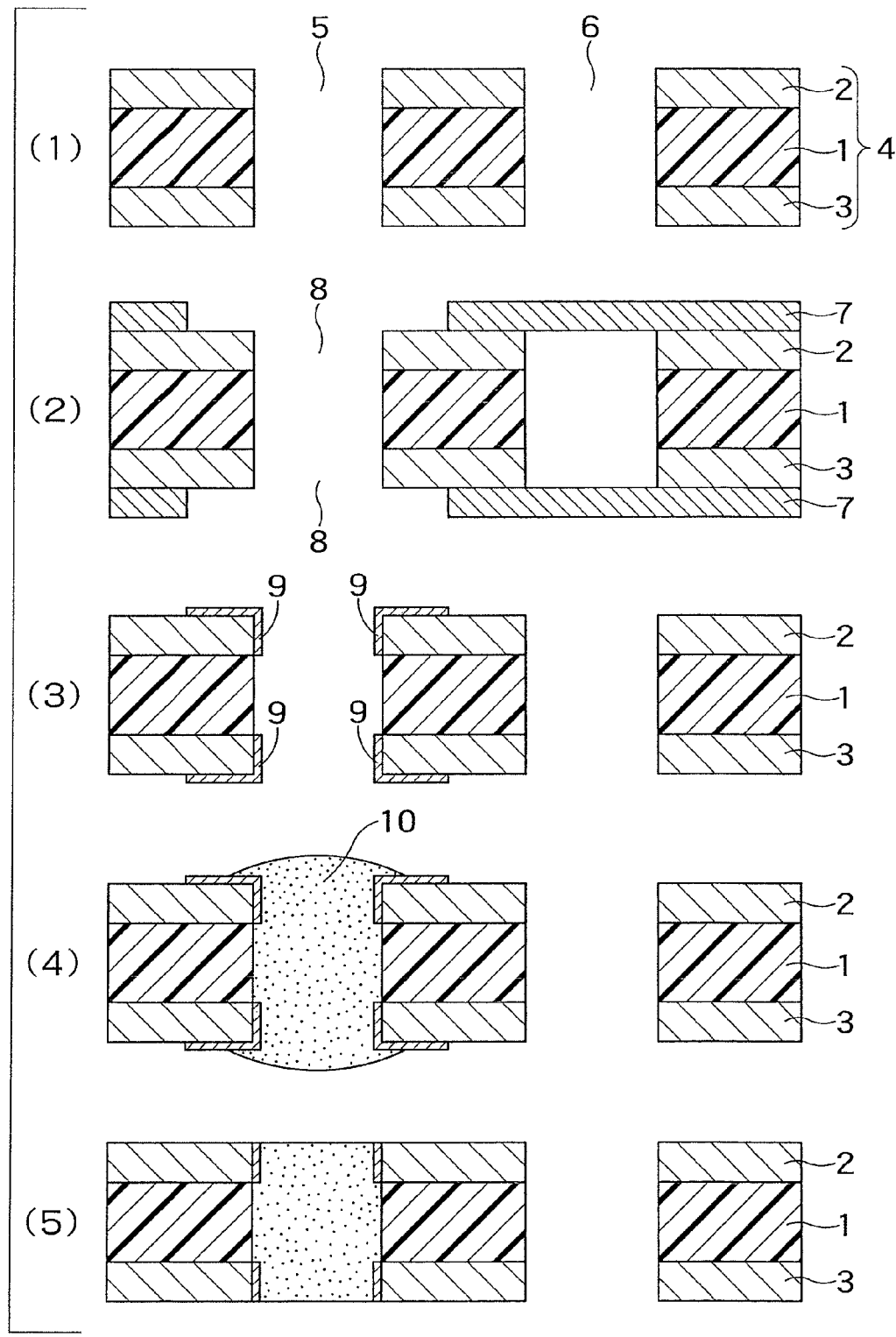
FIG. 1A is a cross section of a process chart illustrating a first half of the process in a first embodiment according to the present invention.
Figure 1B:
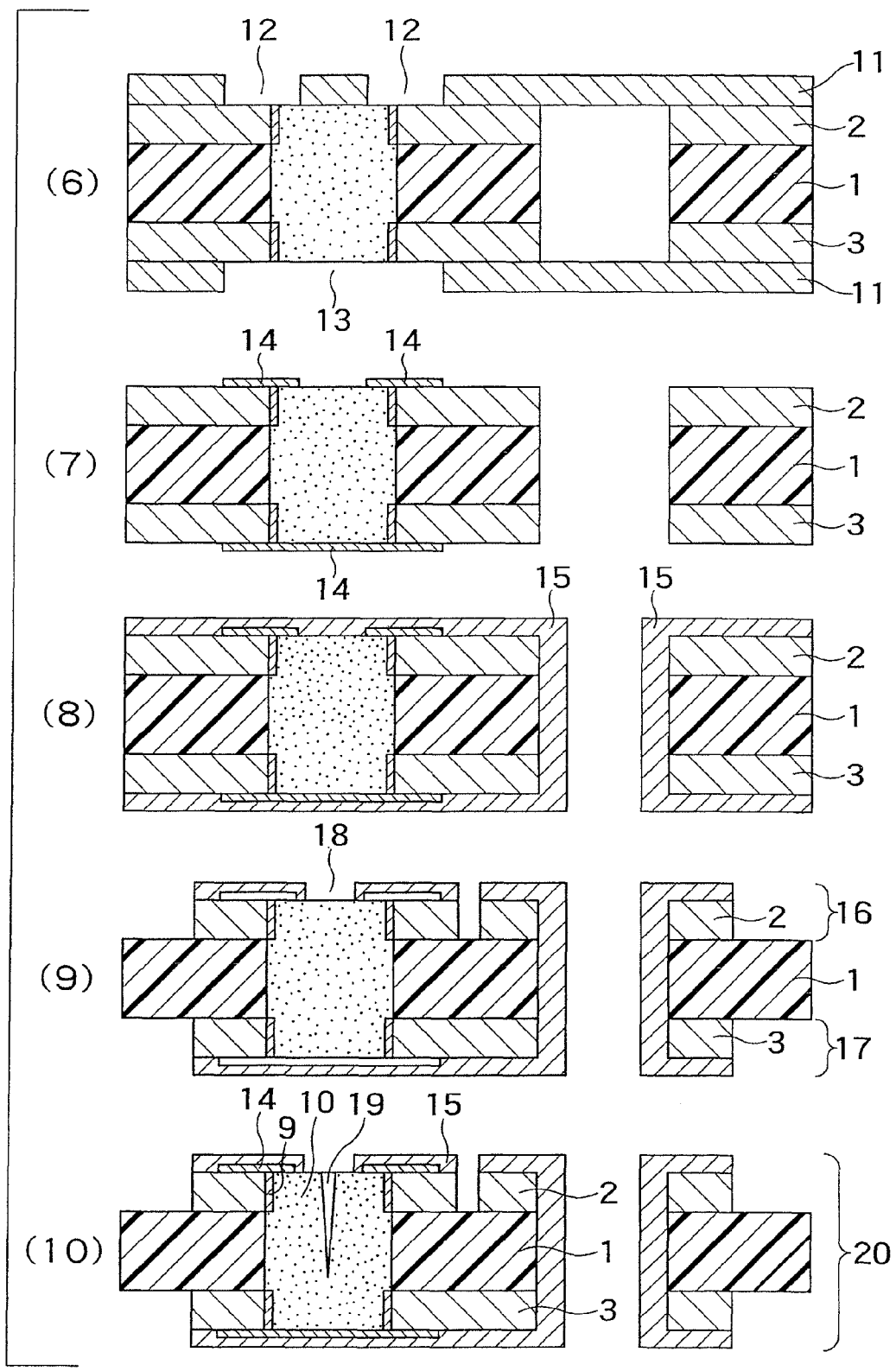
FIG. 1B is a cross section of the process chart illustrating a second half of the process in the first embodiment according to the present invention.

FIGS. 1A and 1B are cross sections of a process chart illustrating a first embodiment according to the present invention. As illustrated in FIG. 1A(1), a so-called double-sided copper clad laminate 4 is prepared in which both sides of an insulating base material 1 of polyimide are provided with a first and a second conductive layer 2 and 3 of copper foil. Through holes 5 and 6 are formed in required positions by drilling or laser process.

The copper clad laminate with a 25-μm thick polyimide layer and a 12-μm thick conductive layer was used and the through hole was 150 μm in diameter. The through hole may be 50 μm to 150 μm in diameter depending on design of the printed circuit board. The through hole was formed by a UV-YAG laser direct machining to stabilize the shape of the through hole. A bottomed hole instead of the through hole may achieve the same effect.

As illustrated in FIG. 1A(2), a dry film 7 is laminated and opening 8 is formed in a predetermined position using the photo fabrication method. In this process, it is desirable to laminate dry film on both sides using a laminater. Also in this process, the dry film was used which is resistant to alkaline treatment of electroless silver plating in the following process.

As illustrated in FIG. 1A(3), the conductive layers 2 and 3 exposed from the dry film 7 are subjected to an electroless silver plating 9 and then the dry film 7 is removed. In this process, other noble metal plating instead of the electroless silver plating may achieve the same effect.

As illustrated in FIG. 1A(4), the through hole 5 is filled with a carbon paste 10 by the screen printing method and the carbon paste 10 is thermoset. A 75-μm thick metallic plate was used to perform the screen printing. A carbon paste TU-10k-8 produced by Asahi Kaken Co., Ltd. was used. Thermosetting was performed in a box-shaped drying oven at a temperature of 170° C. for 60 minutes.

The sheet resistance of the carbon paste may be widely selected from among 50Ω to 1 MΩ. For this reason, selecting the diameter of the hole filled with the carbon paste and the sheet resistance of the carbon paste enables producing 50Ω and 75Ω resistors required for a termination resistor in a transmission line and 10 kΩ to 100 kΩ resistors required for a pull-up and a pull-down resistor at discretion.

As illustrated in FIG. 1A(5), both sides are smoothened by polishing and subjected to a conducting treatment. In this process, chemical polishing is desirable in consideration of dimensional stability.

As illustrated in FIG. 1B(6), a dry film 11 is laminated and openings 12 and 13 are formed in predetermined positions using the photo fabrication method. In this process, it is desirable to laminate dry film on both sides using a laminater. Also in this process, the dry film was used which is resistant to alkaline treatment of electroless silver plating in the following process.

The opening of silver plating on the through hole filled with the carbon paste was taken to be 75 μm in diameter to perform trimming.

As illustrated in FIG. 1B(7), the conductive layers 2 and 3 and the carbon paste 10 exposed from the dry film 11 are subjected to a silver plating 14 and then the dry film 11 is removed.

In this process, other noble metal plating instead of the silver plating may achieve the same effect.

As illustrated in FIG. 1B(8), the first and second conductive layers 2 and 3, the silver plating 14 and the wall surfaces of through hole 6 are subjected to a conducting treatment to form a plating film 15.

As illustrated in FIG. 1B(9), the first and the second conductive layers 2 and 3 and the plating film 15 are etched by the photo fabrication method to form circuit patterns 16 and 17 and an opening 18 on the through hole filled with the carbon paste. The opening is 25 μm in diameter. It is probable to form an opening larger in diameter than that of the silver plating on the through hole.

As illustrated in FIG. 1B(10), performing trimming 19 using laser processing provides a printed circuit board 20 incorporating the resistance element whose resistance is adjusted. It is important not to apply laser to the opened electrode portion during the trimming in order to improve the accuracy of resistance. Probing a single side or double sides depending upon the design of the board allows measuring resistance during the trimming.

Thus, opening the plating portion on the end of the through hole or bottomed hole filled with the carbon paste enables resistance to be adjusted by trimming such as laser processing after the resistor has been formed. This is because forming the noble metal plating on the entire copper surface contacting the carbon paste allows avoiding such a problem that the resistance element is influenced by moisture and oxygen in the air to increase contact resistance at the interface between the copper electrode and the carbon paste to increase resistance.

Second Embodiment

Figure 2:
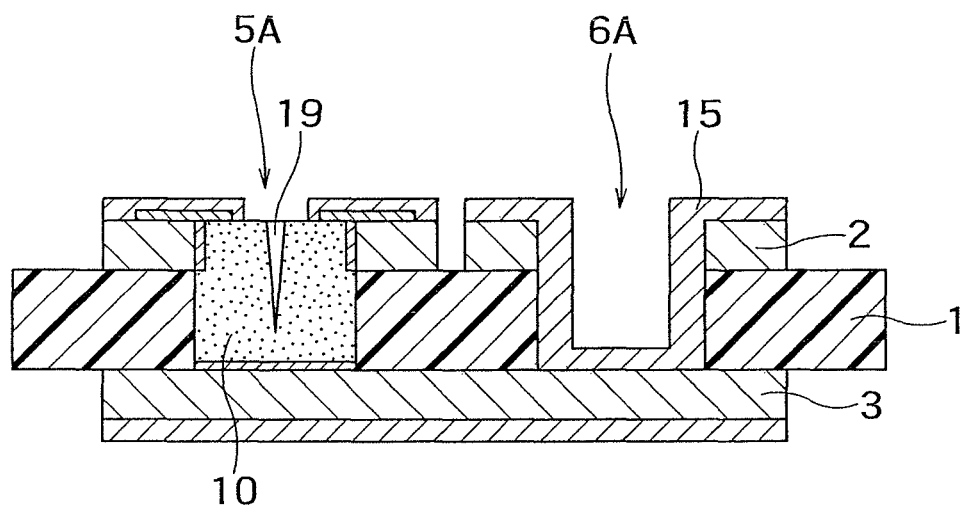
FIG. 2 is a cross section of a process chart illustrating a second embodiment according to the present invention.

FIG. 2 is a cross section illustrating a second embodiment according to the present invention. The second embodiment is an example in which the present invention is applied to a printed circuit board using bottomed holes 5A and 6A instead of the through holes 5 and 6 (FIG. 1A) in the first embodiment.

When a resistor using the bottomed hole 5A is formed, a vacuum screen printing machine (not shown) may be used to prevent a void from being produced in the bottomed hole 5A when the bottomed hole 5A is filled with the carbon paste 10.

Third Embodiment

Figure 3:
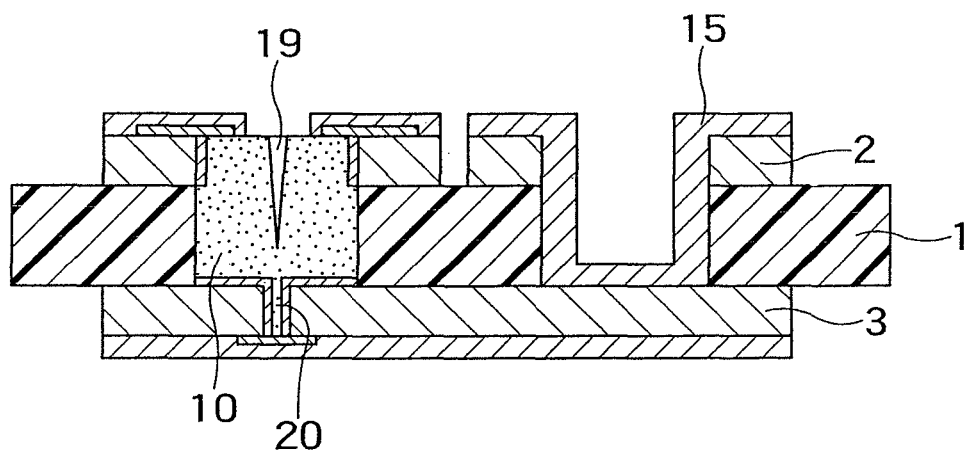
FIG. 3 is a cross section of a process chart illustrating a third embodiment according to the present invention.
Figure 4:
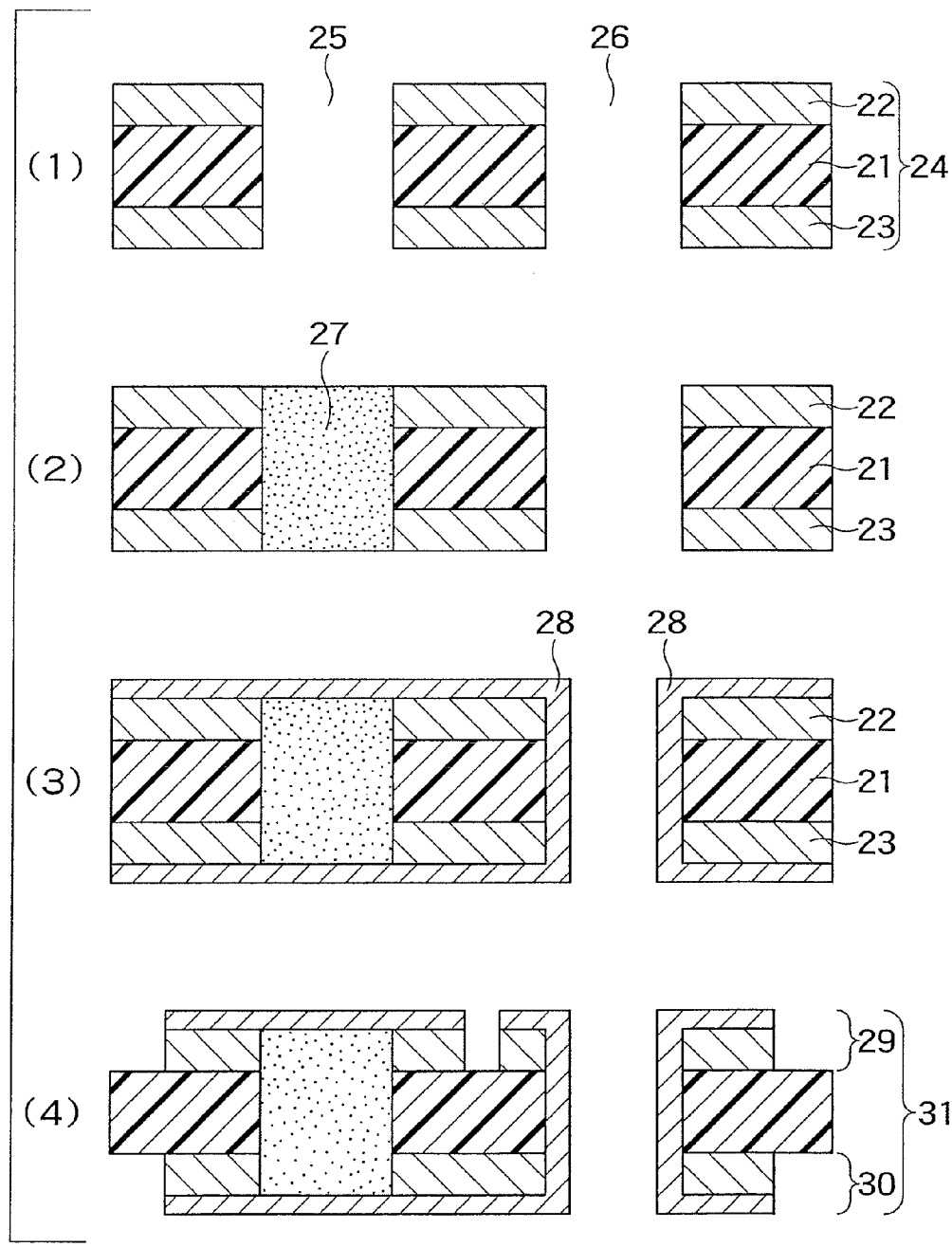
FIG. 4 is a cross section of a process chart illustrating a method of producing a printed circuit board incorporating a resistance element using conventional carbon paste.

FIG. 3 is a cross section illustrating a third embodiment according to the present invention. The third embodiment is also an example in which the present invention is applied to a printed circuit board using bottomed holes 5A and 6A instead of the through holes 5 and 6 (FIG. 1A) in the first embodiment.

In this case, forming a small through hole 20 with a diameter of about 15 μm on the bottom of the bottomed hole 5A enables filling the bottomed hole 5A with the carbon paste 10 without producing voids therein even if an ordinary screen printing machine is used.

What is claimed is:

1. A method of producing a printed circuit board incorporating a resistance element using carbon paste comprising:
   forming a through hole in a double-sided copper clad laminate;
   applying noble metal plating into the through hole;
   filling the through hole with carbon paste;
   subjecting the carbon paste with which the thorough hole is filled to noble metal plating, conducting treatment and plating to form a conductive layer;
   forming an opening in the conductive layer on the end of the through hole filled with the carbon paste; and
   performing trimming through the opening to adjust the resistance of the resistor formed by the carbon paste.

\* \* \* \* \*